United States Patent
Lin

(10) Patent No.: US 11,923,858 B2
(45) Date of Patent: Mar. 5, 2024

(54) CLOCK DATA RECOVERY CIRCUIT

(71) Applicant: Realtek Semiconductor Corp., HsinChu (TW)

(72) Inventor: Yi-Jyun Lin, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 50 days.

(21) Appl. No.: 17/864,413

(22) Filed: Jul. 14, 2022

(65) Prior Publication Data
US 2023/0132188 A1 Apr. 27, 2023

(30) Foreign Application Priority Data

Oct. 25, 2021 (TW) .................................. 110139487

(51) Int. Cl.
| | |
|---|---|
| *H04L 7/033* | (2006.01) |
| *H03L 7/08* | (2006.01) |
| *H03L 7/081* | (2006.01) |
| *H03L 7/099* | (2006.01) |

(52) U.S. Cl.
CPC .......... *H03L 7/0807* (2013.01); *H03L 7/0816* (2013.01); *H03L 7/0994* (2013.01)

(58) Field of Classification Search
CPC ............ H04L 7/033; H04L 7/0337; H04L 2027/0067; H04L 67/12; H04L 7/0331; H04L 1/0057; H04L 1/0041; H04L 27/2657; H03L 7/087; H03L 7/0807; H03L 7/0891; H03L 7/093; H03L 7/091; H03L 7/113; H03L 7/099; H03L 7/085; H03L 7/0995; H04W 88/085

USPC ........................................................ 375/376
See application file for complete search history.

(56) References Cited

U.S. PATENT DOCUMENTS

| | | | |
|---|---|---|---|
| 11,128,304 B1* | 9/2021 | Yao | H04L 7/033 |
| 2011/0169535 A1* | 7/2011 | Kyles | H03L 7/0807 327/156 |
| 2011/0228887 A1 | 9/2011 | Kim | |
| 2012/0062291 A1* | 3/2012 | Saitoh | H04L 7/033 327/157 |
| 2020/0119739 A1* | 4/2020 | Shin | H03L 7/0807 |
| 2021/0067310 A1* | 3/2021 | Lim | H04L 7/0004 |
| 2022/0407677 A1* | 12/2022 | Weng | H04L 7/033 |

FOREIGN PATENT DOCUMENTS

TW 201318349 A1 5/2013

\* cited by examiner

*Primary Examiner* — Eva Y Puente
(74) *Attorney, Agent, or Firm* — Winston Hsu

(57) ABSTRACT

A clock data recovery circuit includes a phase detector, a first signal processing path, a second signal processing path, an oscillator circuit and a phase control circuit. The phase detector samples input data signal according to first clock signals to generate an up control signal and a down control signal. The first signal processing path includes at least one first signal processing device generating a phase control signal according to the up control signal and the down control signal. The second signal processing path includes at least one second signal processing device generating a frequency control signal according to the up control signal and the down control signal. The oscillator circuit generates second clock signals according to the frequency control signal. The phase control circuit controls phases of the second clock signals according to the phase control signal to generate the first clock signals.

16 Claims, 5 Drawing Sheets

CLOCK DATA RECOVERY CIRCUIT

BACKGROUND OF THE INVENTION

1. Field of the Invention

The invention relates to a novel structure of a Clock Data Recovery (CDR) circuit, more particular to a structure of a CDR circuit with characteristics of low power consumption and high performance.

2. Description of the Prior Art

To communicate data from one device to another, the receiving device must know when to sample the data signal that it receives from the transmitting device. Typically, a phase lock loop (PLL) or a delay locked loop (DLL) is used to generate the required frequency waveform. The receiving device requires a clock alignment and regeneration circuit such as the PLL and/or the DLL to regenerate the correct clock frequency from a reference clock signal and synchronize the clock phase with the input data. The clock data recovery (CDR) circuit is the one usually used to output synchronized clock signal and recover the data.

Conventional CDR circuit provides the clock signal through an external independent PLL circuit. However, the more number of channels there is and the longer the transmission distance it is, the more number of clock buffers is required, resulting in a great amount of current consumption. In addition, since the input signal is usually a high-speed signal, a large area is also required in the CDR circuit layout to isolate crosstalk and noise from interfering with other circuits. In addition, the CDR circuit usually samples the input signal first and then performs demultiplexing operations, so as to reduce the data rate and facilitate the subsequent circuits to process the sampled data in a relative low clock rate. However, the lower the demultiplexed clock rate is, the more jitters exit in the regenerated sampling clock signal, resulting in an increase in the data error rate and a degraded performance of the CDR circuit.

Therefore, a novel structure of a CDR circuit with the characteristics of low power consumption and high performance is required to solve the conventional problem.

SUMMARY OF THE INVENTION

It is an objective of the invention to solve the problem of high power consumption and poor performance in the conventional CDR circuit.

According to an embodiment of the invention, a clock data recovery circuit comprises a phase detector, a first signal processing path, a second signal processing path, an oscillator circuit and a phase control circuit. The phase detector is configured to receive an input data signal and a plurality of first clock signals and sample the input data signal according to the first clock signals to generate an up control signal and a down control signal. The first signal processing path is coupled to the phase detector and comprises at least one first signal processing device configured to receive the up control signal and the down control signal and generate a phase control signal according to the up control signal and the down control signal. The second signal processing path is coupled to the phase detector and comprises at least one second signal processing device configured to receive the up control signal and the down control signal and generate a frequency control signal according to the up control signal and the down control signal. The oscillator circuit is configured to generate a plurality of second clock signals according to the frequency control signal. The phase control circuit is configured to receive the second clock signals and the phase control signal and control phases of the second clock signals according to the phase control signal to generate the first clock signals.

According to another embodiment of the invention, a clock data recovery circuit comprises a phase detector, a first signal processing path, a second signal processing path, an oscillator circuit and a phase control circuit. The phase detector is configured to receive an input data signal and a plurality of first clock signals and sample the input data signal according to the first clock signals to generate an up control signal and a down control signal. The first signal processing path is coupled to the phase detector and comprises at least one first signal processing device configured to receive the up control signal and the down control signal and generate a phase control signal according to the up control signal and the down control signal. The second signal processing path is coupled to the phase detector and comprises at least one second signal processing device configured to receive the up control signal and the down control signal and generate a frequency control signal according to the up control signal and the down control signal. The oscillator circuit is configured to generate a plurality of second clock signals according to the frequency control signal. The phase control circuit is configured to receive the second clock signals and the phase control signal and control phases of the second clock signals according to the phase control signal to generate the first clock signals. A data processing rate on the second signal processing path is lower than a data processing rate on the first signal processing path.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
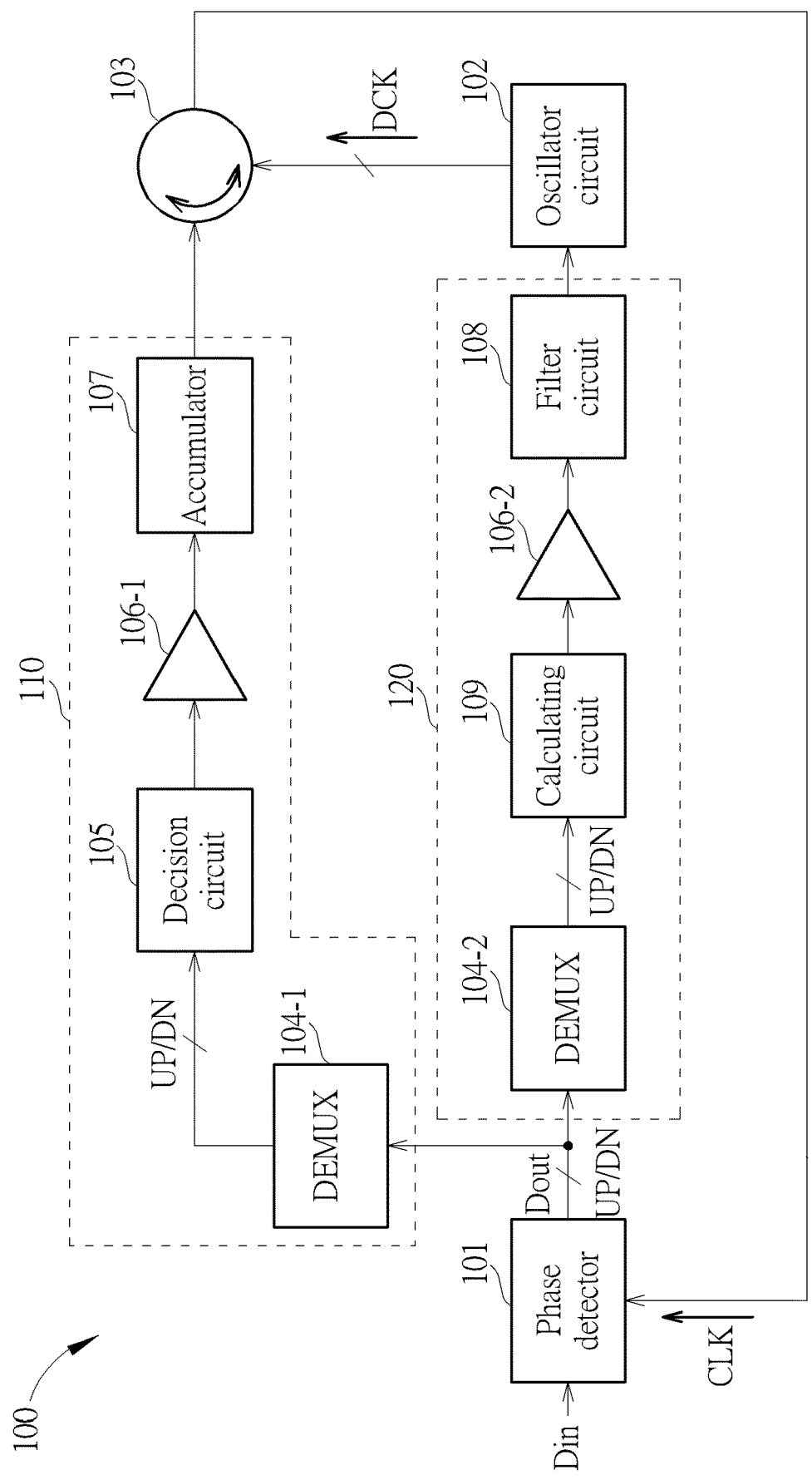
FIG. 1 illustrates an exemplary block diagram of a Clock Data Recovery circuit according to an embodiment of the invention.

FIG. 1 illustrates an exemplary block diagram of a Clock Data Recovery (CDR) circuit according to an embodiment of the invention. The CDR circuit 100 is configured to receive an input data signal Din and sample the input data signal Din according to at least one clock signal CLK to generate the output data signal Dout. Besides recovering content of the data, the CDR circuit 100 may also keep adjusting a frequency and a phase of the clock signal CLK according to the input data signal Din so as to synchronize the clock signal CLK phase with the input data.

It is to be noted that since the proposed structure of CDR circuit is focused on solving the problem of high power consumption and jitters in the clock signal, in the following embodiments, the illustrations about operations of data recovery of the CDR circuit will be omitted and the focus of the embodiments will be put on the operations regarding clock recovery.

The CDR circuit 100 may comprise a phase detector 101, an oscillator circuit 102, a phase control circuit 103 and two separated signal processing paths coupled to the phase detector 101. The phase detector 101 is configured to receive the input data signal Din and a plurality of first clock signals, and sample the input data signal Din according to the first clock signals to generate at least an up control signal UP and at least a down control signal DN.

Figure 2:
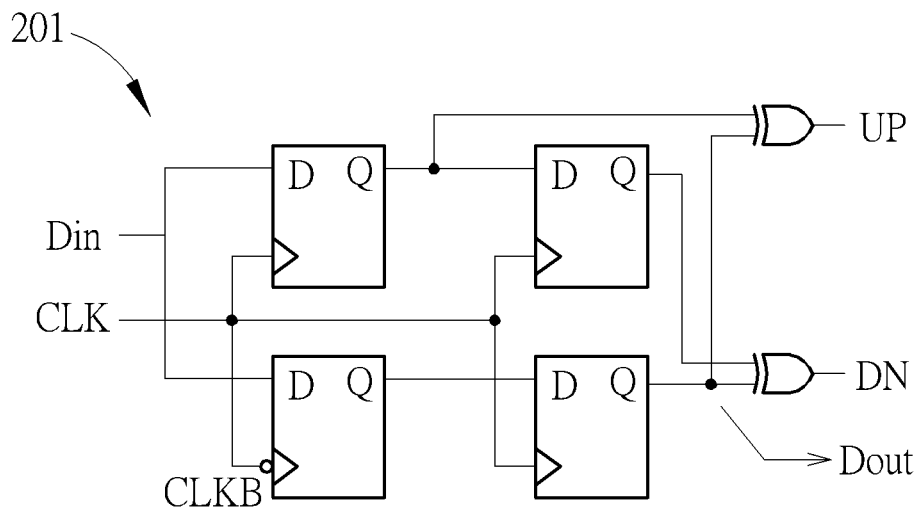
FIG. 2 illustrates an exemplary block diagram of a phase detector according to an embodiment of the invention.

FIG. 2 illustrates an exemplary block diagram of a phase detector according to an embodiment of the invention. In this example, the phase detector 201 is a full-rate bang-bang phase detector (BBPD). The phase detector 201 may comprise a plurality of logic circuits, such as the plurality of flip-flops and exclusive OR (XOR) gates, but it is to be noted that the invention should not be limited thereto. The phase detector 201 may receive input data signal Din and a plurality of first clock signals including the clock signal CLK and the inverse clock signal CLKB (such as the clock signal provided to the clock input terminal of the flip-flop as shown in the lower left corner in FIG. 2). The phase detector 201 may sample the input data signal Din according to the clock signal CLK and the inverse clock signal CLKB to generate an up control signal UP and a down control signal DN.

Figure 3:
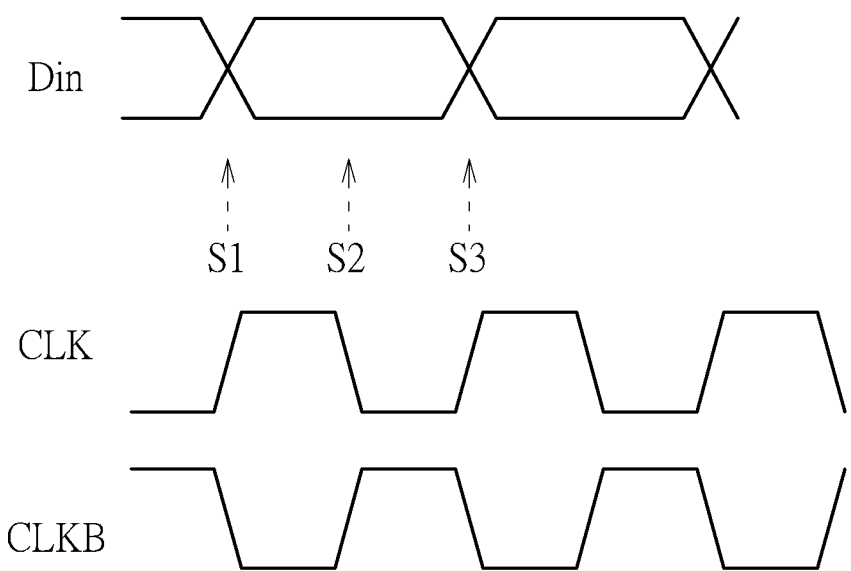
FIG. 3 is a diagram showing the exemplary waveforms of the data input signal and the clock signal according to an embodiment of the invention.

FIG. 3 is a diagram showing the exemplary waveforms of the data input signal and the clock signal according to an embodiment of the invention, for illustrating the operations of the phase detector 201. The phase detector 201 may use the rising edges of the inverse clock signal CLKB (which is equivalent to the falling edges of the clock signal CLK) to sample the input data signal Din and use the rising edges of the clock signal CLK to sample the edges (or called the transitions) of the input data signal Din, and these operations are equivalent to oversampling in a double sampling rate. After the sequentially obtained sampling results are provided to the XOR gates as shown in FIG. 2, the up control signal UP and the down control signal DN are generated. The values of the up control signal UP and the down control signal DN indicate whether there is a lead or lag, compared to the input data, in the phase of the clock signal. As an example, when the rising edge of the clock signal deviates to the left, the sampling result of the edge S1=1, which is the content of the previous data, the sampling result of the input data S2=0, and after the operation of the XOR gate, the value of the down control signal DN is equal to 1 (DN=1), which means that the phase of the clock signal CLK is currently leading. When the rising edge of the clock signal deviates to the right, the sampling result of the edge S3=1, the sampling result of the input data S2=0, and after the operation of the XOR gate, the value of the up control signal UP is equal to 1 (UP=1), which means that the phase of the clock signal CLK is lagged.

It is to be noted that FIG. 2 and FIG. 3 show the exemplary circuit and operations of the full-rate BBPD. Those skilled in the art will readily appreciate that the implementation of phase detector is not limited to the example shown in FIG. 2. As an example, in other embodiments of the invention, the phase detector may also be implemented by a half-rate BBPD, a quarter-rate BBPD, or the likes. When the phase detector is implemented as a half-rate BBPD or a quarter-rate BBPD, the number of clock signals utilized in the sampling operations, the phase difference and the number of generated up control signal UP and the down control signal DN may be adjusted, accordingly. In addition, in the embodiments of the invention, the phase detector is not limited be implemented by the BBPD. In other embodiments of the invention, the phase detector may also be implemented by another type of phase detector.

Referring back to FIG. 1, in the embodiments of the invention, the CDR circuit 100 may separate two signal processing paths after the phase detector 110, comprising the signal processing path 110 (e.g., the first signal processing path or the proportional signal processing path) and the signal processing path 120 (e.g., the second signal processing path or the integral signal processing path), wherein the two signal processing paths may process the received signal in different signal processing rates.

According to an embodiment of the invention, the signal processing path 110 may comprise at least one first signal processing device configured to receive the up control signal UP and the down control signal DN and generate a phase control signal according to the up control signal UP and the down control signal DN. The signal processing path 120 may comprise at least one second signal processing device configured to receive the up control signal UP and the down control signal DN and generate a frequency control signal according to the up control signal UP and the down control signal DN.

According to an embodiment of the invention, the input data signal Din, the up control signal UP and the down control signal DN may be serial signals, wherein the value of the up control signal UP and the value of the down control signal DN may be the control signals sequentially generated in accordance with the sampling results of the input data signal Din. The up control signal UP and the down control signal DN may be converted to a first number of parallel signals on the signal processing path 110 and the up control signal UP and the down control signal DN may be converted to a second number of parallel signals on the signal processing path 120, wherein the second number is greater than the first number, so that the data processing rate on the signal processing path 120 may be lower than that on the signal processing path 110. Therefore, in an embodiment of the invention, an operation frequency of said at least one second signal processing device is lower than an operation frequency of said at least one first signal processing device.

According to an embodiment of the invention, the CDR circuit 100 may further comprise a demultiplexer (DEMUX) 104-1, a decision circuit 105, a weighting circuit 106-1 and an accumulator configured on the signal processing path 110. The demultiplexer 104-1 may be configured to receive the up control signal UP and the down control signal DN from the phase detector 101 and respectively demultiplex the up control signal UP and the down control signal DN to generate the first number of demultiplexed up control signals and the first number of demultiplexed down control signals. As an example, the demultiplexer 104-1 may be an N-order demultiplexer and configured to generate N parallel demultiplexed up control signals and N parallel demultiplexed down control signals, thereby reducing the bit rate (e.g., bit per second (bps)) of the input data (e.g. divided by N), the up control signal and the down control signal on the signal processing path 110. As an example, suppose that the original data rate (bit rate) of the input data Din is 20 Gbps, after the processing of the demultiplexer 104-1 by setting N to 4, a single bit rate may be reduced as (20G/4=)5 Gbps. It is to be noted that, although the single bit rate on the signal processing path 110 is decreased, since the demultiplexer 104-1 converts a serial signal into multi-N parallel signals, the overall data rate is still equal to the original data rate of the input data signal Din. In addition, it is to be noted that in the embodiments of the invention, the demultiplexer 104-1 may be optional. Therefore, in some embodiments of the invention, the signal processing path 110 may not include a demultiplexer.

The N parallel demultiplexed up control signals and N parallel demultiplexed down control signals generated by the demultiplexer 104-1 (or, the up control signal UP and the down control signal DN in some embodiments without the demultiplexer) (for brevity, no special notes will be made below) may be provided to the decision circuit 105 (or called a voting circuit) for the decision circuit 105 to generate a decision signal according to values of the N parallel demultiplexed up control signals and values of the N parallel demultiplexed down control signals, so as to determine which phase detection result regarding a phase lag or a phase lead is the majority, or whether the number of the detection result indicating a phase lag and the number of the detection result indicating a phase lead is the same.

Figure 4:
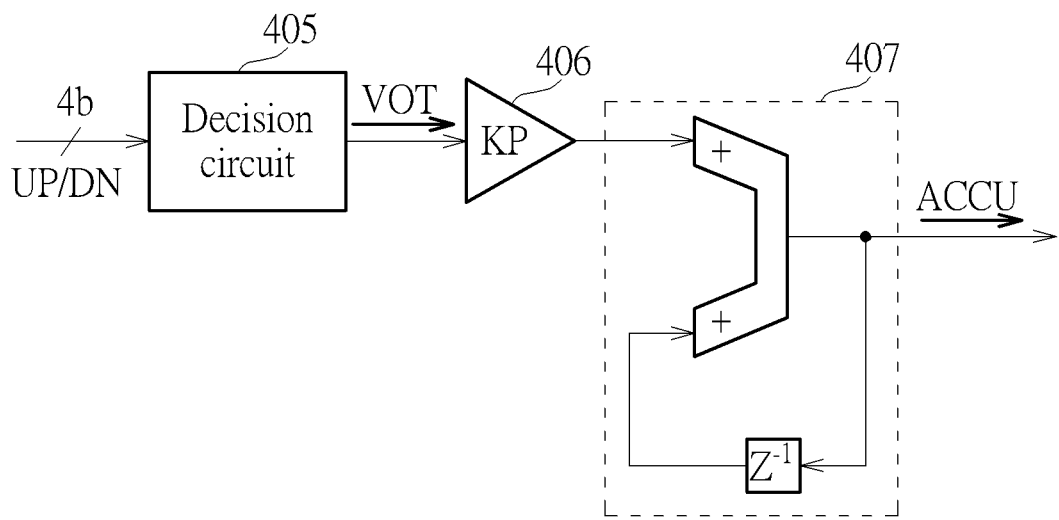
FIG. 4 illustrates a circuit model of a portion of circuits on the proportional signal processing path according to an embodiment of the invention.

FIG. 4 illustrates a circuit model of a portion of circuits on the proportional signal processing path according to an embodiment of the invention. The proportional signal processing path may comprise a decision circuit 405, a weighting circuit 406 and an accumulator 407. In this example, suppose that the order N of the demultiplexer on the proportional signal processing path is 4 (that is, N=4), the decision circuit 405 receives 4 parallel demultiplexed up control signals UP and 4 parallel demultiplexed down control signals DN (hereinafter called demultiplexed control signals UP and DN), such as the 4 bits demultiplexed control signals UP and DN shown in FIG. 4 (labeled by 4*b* UP/DN). The decision circuit 405 may respectively sum up the values of the demultiplexed control signals UP and DN to obtain summation results Sum_UP and Sum_DN and compare the values thereof, where the summation result Sum_UP is a summation of the values carried by the 4 parallel demultiplexed up control signals UP and the summation result Sum_DN is a summation of the values carried by the 4 parallel demultiplexed down control signal DN. When the comparison result shows that Sum_UP>Sum_DN, it means that the phase detection result indicating a phase lag is the majority among the multiple phase detection results and the decision circuit 405 may set the value of the decision signal VOT to +1. When the comparison result shows that Sum_UP<Sum_DN, it means that the phase detection result indicating a phase lead is the majority among the multiple phase detection results and the decision circuit 405 may set the value of the decision signal VOT to −1. When the comparison result shows that Sum_UP=Sum_DN, the decision circuit 405 may set the value of the decision signal VOT to 0. In an embodiment of the invention, the decision signal VOT may be a signed value and may be represented by 2 bits, wherein the amount of valid data is 1 bit.

The weighting circuit 406 may multiply the decision signal VOT by a weighting value KP. The accumulator 407 may receive the decision signal VOT (or, the weighted decision signal VOT) from the weighting circuit 406 and accumulate the values of the decision signal VOT to generate an accumulated signal ACCU as the phase control signal provided to the phase control circuit.

Referring back to FIG. 1 again, the CDR circuit 100 may further comprise a demultiplexer (DEMUX) 104-2, a calculating circuit 109 a weighting circuit 106-2 and a filter circuit 108. The demultiplexer 104-2 may be configured to receive the up control signal UP and the down control signal DN, and respectively demultiplex the up control signal UP and the down control signal DN to generate the second number of demultiplexed up control signals and the second number of demultiplexed down control signals. As an example, the demultiplexer 104-2 may be an M-order demultiplexer and configured to generate M parallel demultiplexed up control signals and M parallel demultiplexed down control signals, thereby reducing the single bit rate (bps) of the input data, the up control signal and the down control signal on the signal processing path 120. According to an embodiment of the invention, the order M of the demultiplexer 104-2 may be greater than the order N of the demultiplexer 104-1. In this manner, the bit rate of the data and signal transmitted on the signal processing path 120 may be much lower than that on the signal processing path 110.

Suppose that the original data rate (bit rate) of the input data signal Din is 20 Gbps, after the processing of the demultiplexer 104-2 by setting M to 32, the single bit rate may be reduced to (20G/32=)625 Mbps. It is to be noted that although the bit rate on the signal processing path 120 is reduced, the overall data rate is still equal to the original data rate of the input data signal Din since the demultiplexer 104-2 convers the serial signal into M parallel signals.

The M parallel demultiplexed up control signals and the M parallel demultiplexed up control signals generated by the demultiplexer 104-2 may be further provided to the calculating circuit 109. The calculating circuit 109 may calculate a difference between the M parallel demultiplexed up control signals and the M parallel demultiplexed up control signals to generate a difference signal.

Figure 5:
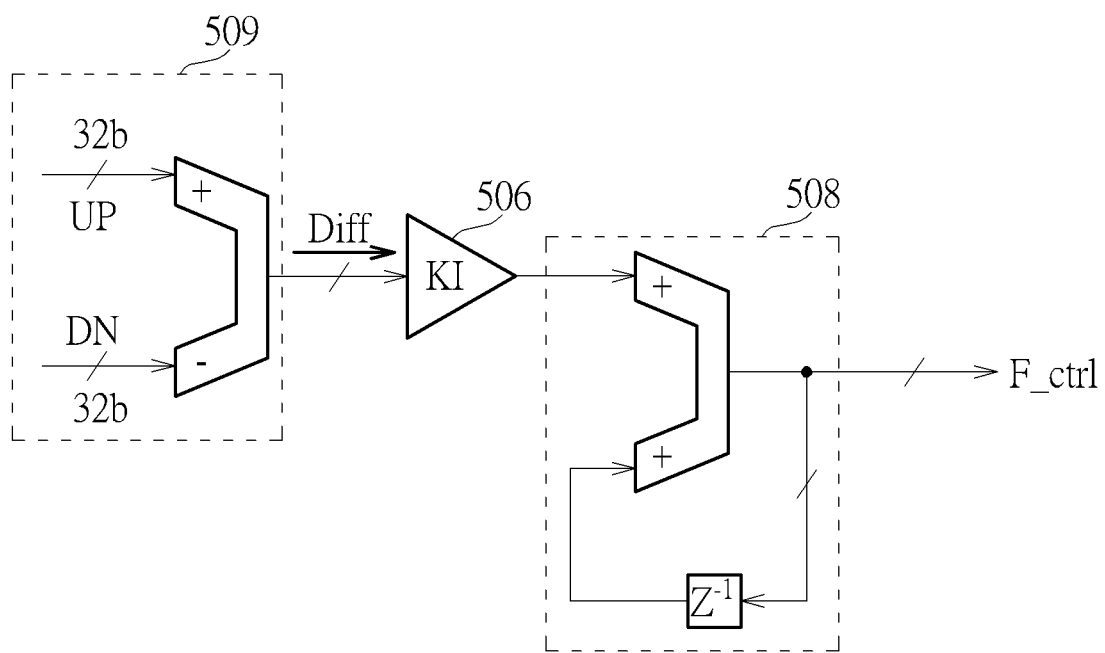
FIG. 5 illustrates a circuit model of a portion of circuits on the integral signal processing path according to an embodiment of the invention.

FIG. 5 illustrates a circuit model of a portion of circuits on the integral signal processing path according to an embodiment of the invention. The integral signal processing path may comprise a calculating circuit 509, a weighting circuit 506 and a filter circuit 508. In this example, suppose that the order M of the demultiplexer on the integral signal processing path is 32 (that is, M=32), the calculating circuit 509 may receive 32 (labeled by 32*b*) parallel demultiplexed up control signals and the 32 (labeled by 32*b*) parallel demultiplexed up control signals (hereinafter collectively called demultiplexed control signals UP and DN). The calculating circuit 509 may respectively sum up the values of the demultiplexed control signals UP and DN to obtain summation results Sum_UP and Sum_DN and calculate a difference between the summation results, wherein in this example of the integral signal processing path, the summation result Sum_UP may be a summation of the values of the 32 parallel demultiplexed up control signals UP and the summation result Sum_DN may be a summation of the values of the 32 parallel demultiplexed down control signals DN.

The calculating circuit 509 may subtract the summation result Sum_DN from the summation result Sum_UP to generate the difference signal Diff. In an embodiment of the invention, the difference signal Diff may be a signed value and may be represented by multiple bits.

The weighting circuit 506 may multiply the difference signal Diff by a weighting value KI. The filter circuit 508 may receive the difference signal Diff (or, the weighted difference signal Diff) from the weighting circuit 506 and filter the difference signal Diff to generate a filtered signal as the frequency control signal F_ctrl provided to the oscillator circuit. According to an embodiment of the invention, suppose that the value of the difference signal Diff is represented by multiple bits (for example, 20 bits), the filter circuit 508 may perform the filtering operation by outputting only a portion of bits (e.g., 10 bits) of the difference signal Diff. As an example, the filter circuit 508 may select 10 bits from the most significant bit (MSB) from the bus transmitting the difference signal Diff as the output frequency control signal F_ctrl. In this manner, the effect of filtering is achieved to remove the noise in the difference signal Diff, so that the frequency of the clock signal will not be easily changed due to some small change in the value of the difference signal Diff.

Figure 6:
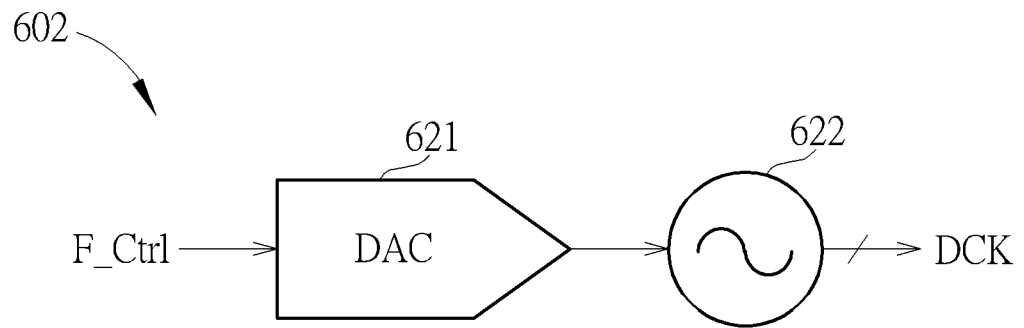
FIG. 6 illustrates an exemplary block diagram of an oscillator circuit according to an embodiment of the invention.

FIG. 6 illustrates an exemplary block diagram of an oscillator circuit according to an embodiment of the invention. The oscillator circuit 602 may comprise a digital to analog converter (DAC) 621 and a voltage controlled oscillator (VCO) 622. The DAC 621 may be configured to convert the received frequency control signal F_ctrl, which is a digital signal, into an analog voltage signal. The VCO 622 receives the analog voltage signal and generates a plurality of clock signals according to the analog voltage signal, wherein the frequencies of the plurality of clock signals are the identical and predetermined phase differences exist among the clock signals. It is to be noted that since the plurality of clock signals have the identical frequency and only different in phase, for simplification in the drawing as well as the description, the plurality of clock signals are represented by DCK in FIG. 6 and the following paragraphs. According to an embodiment of the invention, the number of clock signals DCK generated by the oscillator circuit 102/602 is related to the design of the phase detector. As an example, when the phase detector is implemented as a full-rate phase detector, the oscillator circuit 102/602 may generate two clock signals with the same frequency and opposite phases (i.e., 180 degrees phase difference). When the phase detector is implemented as a half-rate phase detector, the oscillator circuit 102/602 may generate four clock signals with the same frequency and 90 degrees phase difference, and so on.

Referring back to FIG. 1 again, the phase control circuit 103 may receive the plurality of clock signals DCK from the oscillator circuit 102 and receive the phase control signal from the accumulator 107, and control the phase of the clock signals DCK to generate the plurality of clock signal required by the phase detector, e.g., the clock signals CLK and CLKB (for simplification in the drawing, the clock signals CLK and CLKB are represented by the clock signal CLK in FIG. 1). According to an embodiment of the invention, the phase control circuit 103 may be a phase interpolator or a digital to phase converter (DPC).

Figure 7:
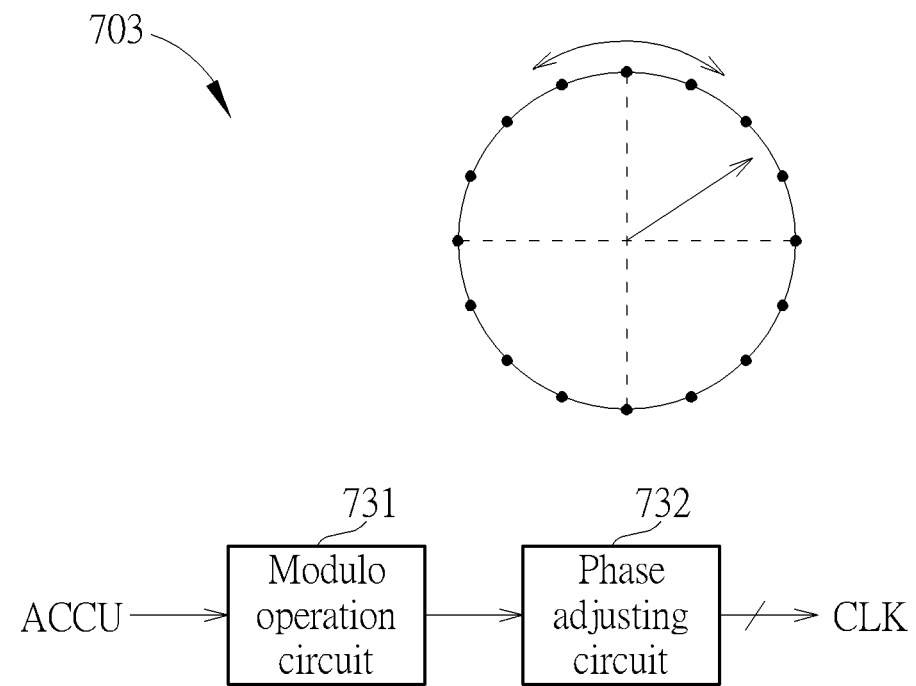
FIG. 7 illustrates a circuit model of the phase control circuit according to an embodiment of the invention.

FIG. 7 illustrates a circuit model of the phase control circuit according to an embodiment of the invention. The phase control circuit 703 may comprise a modulo operation circuit 731 and a phase adjusting circuit 732. The modulo operation circuit 731 may receive the phase control signal and perform an operation of taking a remainder on the phase control signal to generate a remainder result. As an example, the modulo operation circuit 731 may perform a modulo operation on the phase control signal (i.e., the accumulated signal ACCU) by dividing the phase control signal by a value PI (as an example, PI=16) to obtain a remainder thereof as a remainder result (that is, a modulo result). The phase resolution of the clock signals generated by the phase control circuit 703 may be controlled by the value PI. The phase adjusting circuit 732 may receive the plurality of clock signals DCK from the oscillator circuit 102/602 and receive the remainder result (the modulo result) from the modulo operation circuit 731 and adjust the phases of the clock signals DCK according to the remainder result to generate the clock signals required by the phase detector, such as the clock signals CLK and CLKB (for simplification in the drawing, the clock signals CLK and CLKB are represented by the clock signal CLK in FIG. 7) and provide the clock signals to the phase detector by negative feedback. It is to be noted that the phases of the clock signals DCK generated by the oscillator circuit 102/602 may all be adjusted based on the same adjustment.

A phasor diagram of PI=16 is also shown above the phase adjusting circuit 732 in FIG. 7, for illustrating operations of the phase adjusting circuit. In an embodiment of the invention, the phase adjusting circuit 732 may select a corresponding clock signal as the one provided to the phase detector from PI clock signals with different phases.

Figure 8:
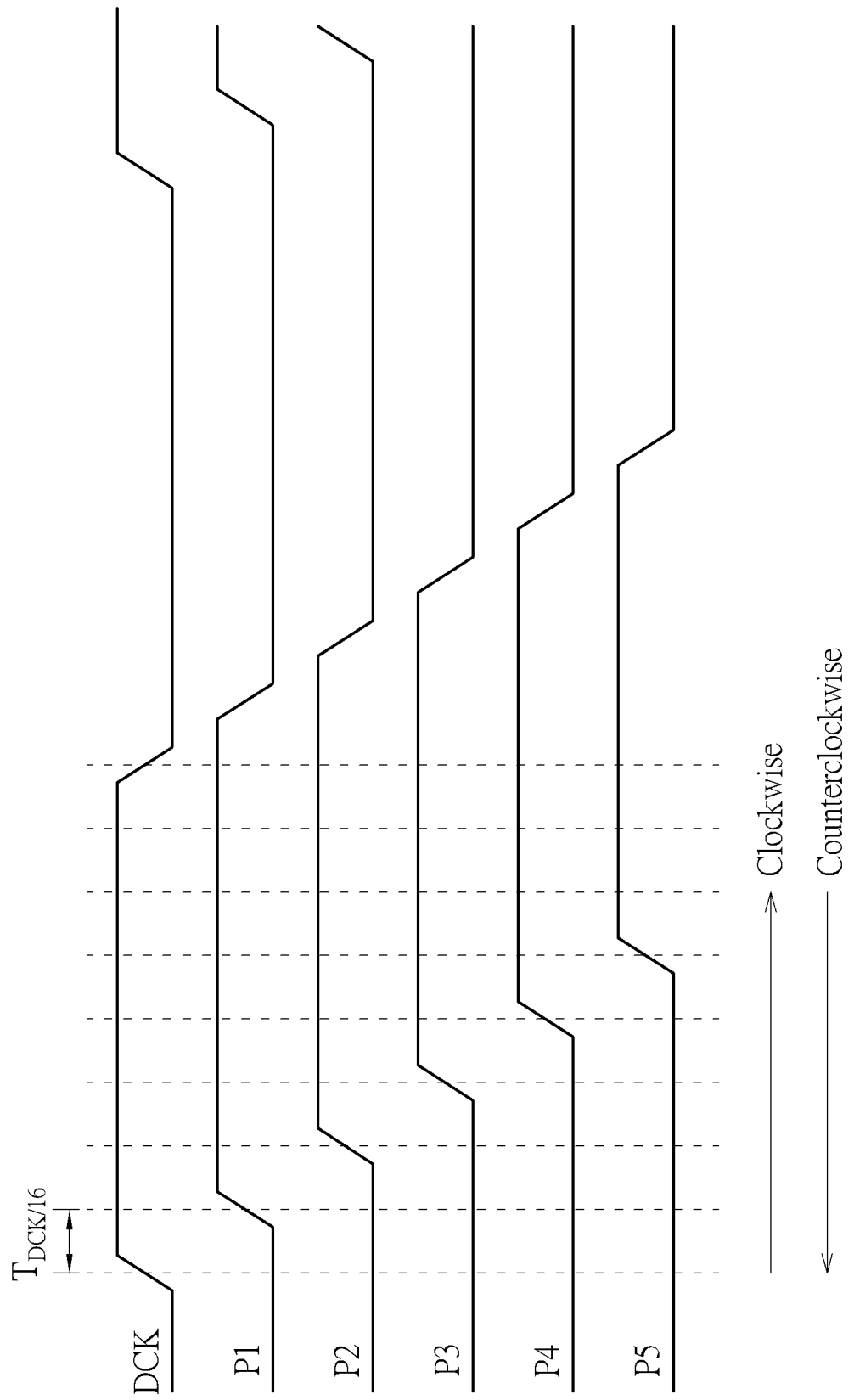
FIG. 8 is a schematic diagram for illustrating the operations of phase control according to an embodiment of the invention.

FIG. 8 is a schematic diagram for illustrating the operations of phase control according to an embodiment of the invention. In this example, PI=16. The phase adjusting circuit 732 may adjust a phase of the clock signal DCK according to the modulo result, which is equivalent to select a corresponding clock signal to be outputted as the one provided to the phase detector from 16 clock signals with different phases (such as the clock signals DCK, P1, P2, P3, P4, P5, . . . , P15 shown in FIG. 8), wherein suppose that the clock period of the clock signal DCK is $T_{DCK}$, the phase difference of the clock signal is $T_{DCK}/16$ and the phase resolution is 360/16 degree. Referring to the operations of the phase adjusting circuit illustrated in FIG. 7, selecting a clock signal with an increased phase difference in FIG. 8 is equivalent to a clockwise phase adjustment in FIG. 7, and selecting a clock signal with a reduced phase difference is equivalent to a counterclockwise phase adjustment in FIG. 7.

In the embodiments of the invention, since the CDR circuit comprises an internal oscillator circuit which occupies a relatively small circuit area, there is no need to provide the clock signal through an external independent PLL circuit as the conventional CDR circuit. Therefore, the current consumption is effectively reduced and the circuit area occupied by the oscillator is small. In addition, since the frequency control signal is generated on the integral signal processing path based on the sampling result of the input data signal, the proposed CDR circuit has the capacity of Spread Spectrum Clocking (SSC), and it is ensured that the product can pass the Jitter Tolerance Test (JTT) and obtain the certification mark. In addition, since the proposed CDR circuit separates the proportional signal processing path (e.g., the signal processing path 110 as shown in FIG. 1) and the integral signal processing path (e.g., the signal processing path 120 as shown in FIG. 1) and uses the demultiplexer of different orders to make the bit rate on the integral signal processing path much lower than the bit rate on the proportional signal processing path. In this manner, the signals processing circuits (e.g., the calculating circuit, the weighting circuit, and filter circuit in FIG. 1) on the integral signal processing path and configured to perform relatively complex signal processing may be designed in the digital domain. As an example, a register transfer level (RTL) description language and an automatic placement and routing (APR) tool may be used to design the circuit, which greatly reduces the difficulty of circuit design and makes the implementation of CDR circuit to be much easier, and effectively solves the problem of having jitter in the clock signal in the conventional art, so that the performance of the CDR circuit is much improved. In addition, since the signal processing devices on the integral signal processing path operate at low frequency, both the circuit area and the power consumption can be effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock data recovery circuit, comprising:
   a phase detector, configured to receive an input data signal and a plurality of first clock signals and sample the input data signal according to the first clock signals to generate an up control signal and a down control signal;
   a first signal processing path, coupled to the phase detector and comprising at least one first signal processing device configured to receive the up control signal and the down control signal and generate a phase control signal according to the up control signal and the down control signal;
   a second signal processing path, coupled to the phase detector and comprising at least one second signal processing device configured to receive the up control signal and the down control signal and generate a frequency control signal according to the up control signal and the down control signal;
   an oscillator circuit, configured to generate a plurality of second clock signals according to the frequency control signal; and
   a phase control circuit, configured to receive the second clock signals and the phase control signal and control phases of the second clock signals according to the phase control signal to generate the first clock signals.

2. The clock data recovery circuit of claim 1, wherein an operation frequency of the at least one second signal processing device is lower than an operation frequency of the at least one first signal processing device.

3. The clock data recovery circuit of claim 1, wherein the input data signal, the up control signal and the down control signal are serial signals, the up control signal and the down control signal are converted to a first number of parallel signals on the first signal processing path, the up control signal and the down control signal are converted to a second number of parallel signals on the second signal processing path, and the second number is greater than the first number.

4. The clock data recovery circuit of claim 3, further comprising:
   a first demultiplexer, on the first signal processing path and configured to receive the up control signal and the down control signal and respectively demultiplex the up control signal and the down control signal to generate the first number of demultiplexed up control signals and the first number of demultiplexed down control signals.

5. The clock data recovery circuit of claim 4, further comprising:
   a decision circuit, on the first signal processing path and configured to receive the first number of demultiplexed up control signals and the first number of demultiplexed down control signals and generate a decision signal according to values of the first number of demultiplexed up control signals and values of the first number of demultiplexed down control signals; and
   an accumulator, on the first signal processing path and configured to receive the decision signal and accumulate values of the decision signal to generate an accumulated signal as the phase control signal.

6. The clock data recovery circuit of claim 3, further comprising:
   a second demultiplexer, on the second signal processing path and configured to receive the up control signal and the down control signal and respectively demultiplex the up control signal and the down control signal to generate the second number of demultiplexed up control signals and the second number of demultiplexed down control signals.

7. The clock data recovery circuit of claim 6, further comprising:
   a calculating circuit, on the second signal processing path and configured to receive the second number of demultiplexed up control signals and the second number of demultiplexed down control signals and calculate a difference between the second number of demultiplexed up control signals and the second number of demultiplexed down control signals to generate a difference signal; and
   a filter circuit, on the second signal processing path and configured to receive and filter the difference signal to generate the frequency control signal.

8. The clock data recovery circuit of claim 1, wherein the phase control circuit further comprises:
   a modulo operation circuit, configured to receive the phase control signal and perform a modulo operation on the phase control signal to generate a remainder result; and
   a phase adjusting circuit, configured to receive the second clock signals and the remainder result and adjust phases of the second clock signals according to the remainder result to generate the first clock signals.

9. A clock data recovery circuit, comprising:
   a phase detector, configured to receive an input data signal and a plurality of first clock signals and sample the input data signal according to the first clock signals to generate an up control signal and a down control signal;
   a first signal processing path, coupled to the phase detector and comprising at least one first signal processing device configured to receive the up control signal and the down control signal and generate a phase control signal according to the up control signal and the down control signal;
   a second signal processing path, coupled to the phase detector and comprising at least one second signal processing device configured to receive the up control signal and the down control signal and generate a frequency control signal according to the up control signal and the down control signal;
   an oscillator circuit, configured to generate a plurality of second clock signals according to the frequency control signal; and
   a phase control circuit, configured to receive the second clock signals and the phase control signal and control phases of the second clock signals according to the phase control signal to generate the first clock signals,
   wherein a data processing rate on the second signal processing path is lower than a data processing rate on the first signal processing path.

10. The clock data recovery circuit of claim 9, wherein an operation frequency of the at least one second signal processing device is lower than an operation frequency of the at least one first signal processing device.

11. The clock data recovery circuit of claim 9, wherein the input data signal, the up control signal and the down control signal are serial signals, the up control signal and the down control signal are converted to a first number of parallel signals on the first signal processing path, the up control signal and the down control signal are converted to a second number of parallel signals on the second signal processing path, and the second number is greater than the first number.

12. The clock data recovery circuit of claim 11, further comprising:
- a first demultiplexer, on the first signal processing path and configured to receive the up control signal and the down control signal and respectively demultiplex the up control signal and the down control signal to generate the first number of demultiplexed up control signals and the first number of demultiplexed down control signals.

13. The clock data recovery circuit of claim 12, further comprising:
- a decision circuit, on the first signal processing path and configured to receive the first number of demultiplexed up control signals and the first number of demultiplexed down control signals and generate a decision signal according to values of the first number of demultiplexed up control signals and values of the first number of demultiplexed down control signals; and
- an accumulator, on the first signal processing path and configured to receive the decision signal and accumulate values of the decision signal to generate an accumulated signal as the phase control signal.

14. The clock data recovery circuit of claim 11, further comprising:
- a second demultiplexer, on the second signal processing path and configured to receive the up control signal and the down control signal, and respectively demultiplex the up control signal and the down control signal to generate the second number of demultiplexed up control signals and the second number of demultiplexed down control signals.

15. The clock data recovery circuit of claim 14, further comprising:
- a calculating circuit, on the second signal processing path and configured to receive the second number of demultiplexed up control signals and the second number of demultiplexed down control signals and calculate a difference between the second number of demultiplexed up control signals and the second number of demultiplexed down control signals to generate a difference signal; and
- a filter circuit, on the second signal processing path and configured to receive and filter the difference signal to generate the frequency control signal.

16. The clock data recovery circuit of claim 9, wherein the phase control circuit further comprises:
- a modulo operation circuit, configured to receive the phase control signal and perform a modulo operation on the phase control signal to generate a remainder result; and
- a phase adjusting circuit, configured to receive the second clock signals and the remainder result and adjust phases of the second clock signals according to the remainder result to generate the first clock signals.

\* \* \* \* \*